United States Patent [19]

Franaszek et al.

[11] Patent Number: 4,486,739
[45] Date of Patent: Dec. 4, 1984

[54] BYTE ORIENTED DC BALANCED (0,4) 8B/10B PARTITIONED BLOCK TRANSMISSION CODE

[75] Inventors: Peter A. Franaszek; Albert X. Widmer, both of Katonah, N.Y.

[73] Assignee: International Business Machines Corporation, Armonk, N.Y.

[21] Appl. No.: 394,045

[22] Filed: Jun. 30, 1982

[51] Int. Cl.³ .............................................. H03K 13/00
[52] U.S. Cl. ................................................ 340/347 DD
[58] Field of Search ............ 340/347 DD; 360/40–44; 375/19, 25; 371/55

[56] References Cited

U.S. PATENT DOCUMENTS 3,577,142  5/1971  McMillin .
3,594,560  7/1971  Stanley .
3,798,635  3/1974  Candiani .
4,309,694  1/1982  Henry ......................... 340/347 DD

OTHER PUBLICATIONS

T. Horiguchi and K. Morita, "An Optimization of Modulation Codes in Digital Recording," in IEEE Transactions on Magnetics, vol. MAG-12, No. 6, Nov. 1976, pp. 740-742.
R. G. Kiwimagi, "Encoding/Decoding for Magnetic Record Storage Apparatus," IBM Technical Disclosure Bulletin, vol. 18, No. 10, Mar. 1976, pp. 3147-3149.
"Binary Code Suitable for Line Transmission," in Electronics Letters, Feb. 20th 1969, vol. 5, No. 4, pp. 79-81.
W. W. Peterson et al., "Cyclic Codes for Error Detection," Proceedings IRE, vol. 49, pp. 228-235, Jan. 1961, Theorem 8.
John F. Wakerly, "Documentation Standards Clarify Design," Computer Design, Feb. 1977, pp. 75-85.

*Primary Examiner*—C. D. Miller
*Attorney, Agent, or Firm*—Roy R. Schlemmer

[57] ABSTRACT

A binary DC balanced code and an encoder circuit for effecting same is described, which translates an 8 bit byte of information into 10 binary digits for transmission over electromagnetic or optical transmission lines subject to timing and low frequency constraints. The significance of this code is that it combines a low circuit count for implementation with excellent performance near the theoretical limits, when measured with the commonly accepted criteria. The 8B/10B coder is partitioned into a 5B/6B plus a 3B/4B coder. The input code points are assigned to the output code points so the number of bit changes required for translation is minimized and can be grouped into a few classes.

20 Claims, 13 Drawing Figures

BYTE ORIENTED DC BALANCED (0,4) 8B/10B PARTITIONED BLOCK TRANSMISSION CODE

BACKGROUND OF THE INVENTION

1. Field of the Invention

The primary purpose of transmission codes is to transform the frequency spectrum of a serial data stream so that clocking can be recovered readily and AC coupling is possible. The code must also provide special characters outside the data alphabet for functions such as character synchronization, frame delimiters and perhaps for abort, reset, idle, diagnostics, etc. Codes are also used, often in combination with signal waveform shaping, to adapt the signal spectrum more closely to specific channel requirements. In most cases a reduction in bandwidth by constraints on both the high and the low frequency components is desirable to reduce distortion in the transmission media, especially electromagnetic cables, or in the band limited receiver, and to reduce the effects of extrinsic and intrinsic noise.

Another aspect of codes is their interaction with noise and errors in the line digits. The redundancy associated with line codes can be used to supplement other error detection mechanisms or to monitor the quality of the channel with a minimal amount of circuitry.

Such codes generally exhibit the undesirable feature of enlarging error bursts in the decoded data, making detection by a cyclic redundancy check more difficult. A good transmission code should minimize these effects.

For fiber optic links and intra-establishment wire links, interest centers for many reasons on the family of two-level codes. For wire links one prefers codes with no DC and little low frequency content in order to DC isolate the transmission line from the driver and receiver circuitry, usually by transformers, and to reduce signal distortion on the line. Although these factors do not apply to the fiber optic case, good low frequency characteristics of the code are helpful for a number of reasons.

The high gain fiber optic receivers need an AC coupling stage near the front end. The control of the drive level, receiver gain, and equalization is simplified and the precision of control is improved, if it can be based on the average signal power, especially at top rates. DC restore circuits tend to lose precision with rising data rates and cease to operate properly below the maximum rates for other circuits required in a transceiver. Finally, if the time constants associated with the parasitic capacitances at the front end of a receiver are comparable to or longer than a baud interval, a signal with reduced low frequency content will suffer less distortion and will enable many links to operate without an equalizing circuit.

The Manchester and related codes are simple two-level codes and solve the clocking and low frequency problems very well. They translate each bit into two bits for transmission and are a good choice whenever the high clocking rates cause no problems in the logic or analog circuits, the transducers or on the transmission line. They also reduce the data transmission rate by a factor of two since they encode 2 bits for every data bit (i.e., rate $\frac{1}{2}$).

Simple 5B/6B codes translate 5 binary bits into 6 binary digits and raise the number of information bits transmitted per baud interval to 0.833. Unfortunately, the implementation of a 5B/6B code in a byte-oriented (8 bit) system causes burdensome complexities. If the encoding and decoding is done serially, most of the circuits needed have to operate at the baud rate, which sometimes is at the technology limits. Also, there is no simple relationship between the byte clock and the coder clock. Finally, if the frames are not multiples of 5 bytes, the character boundaries will not align with the frame boundaries, which is unattractive, whether corrected or not. If the coding and decoding is done in parallel, there is no simple mechanism to align a byte parallel interface with a 5B/6B coder; the most straight-forward way requires shift registers operating at the baud rate.

Background Art

An article by T. Horiguchi and K. Morita, "An Optimization of Modulation Codes in Digital Recording," IEEE Transactions on Magnetics, Vol. MAG-12, No. 6, November 1976, page 740, is in essence a survey article which cites a great many possible formats for run length limited codes having various d, k values and varying coding rates. It is cited for reference purposes, it being noted that there are no codes suggested in this article having parameters even remotely approaching those of the presently disclosed coding system. Similarly the article is not concerned with maintaining dc balance in the resulting code stream.

An article entitled "Encoding/Decoding for Magnetic Record Storage Apparatus," by R. C. Kiwimagi, IBM Technical Disclosure Bulletin, Vol. 18, No. 10, March 1976, page 3147, discloses a (0,6) rate 4/5 run length limited code which attempts to maintain a dc balance. It is noted that this code is significantly different from the present coding system in that both the codes produced and the coder configuration are quite different than that of the present invention even if two of the rate 4/5 coders of this reference were connected in parallel to perform an 8/10 coding operation.

U.S. Pat. No. 3,798,635 of Candiani, entitled "Channel Monitor for Depressed-Code PCM Transmission System," discloses an 8 bit to 12 bit code expansion system. It does not disclose the present system's dc balanced run length limited codes.

U.S. Pat. No. 3,577,142 of McMillin, entitled "Code Translation System," discloses a system for translating a 12 bit code into a 8 bit code and is cited as background but does not relate to the present run length limited coding systems.

U.S. Pat. No. 3,594,560 of Stanley, entitled "Digital Expander Circuit," discloses a simple expander for pre-compressed data and is similar to the two patents cited above representatives of the state of the art and is not otherwise related to run length limited coding systems.

An article entitled "Binary Codes Suitable for Line Transmission," Electronics Letters, Vol. 5, No. 4, pp. 79-81, 20 February 1969, generally describes a DC balanced rate 5/6 and 3/4 codes but does not suggest combining same nor does it show similar embodiment circuitry.

No prior art is known to the inventors, which partitions an 8 bit code into 5 bit and 3 bit sub-blocks for encoding purposes nor discloses coding circuitry for concurrently doing the logic manipulations for computing the proper code words, the disparity of said code words and, depending upon the disparity of the preceeding sub-block, concurrently determining whether a given code word or its complement will be coded.

SUMMARY AND OBJECTS OF THE INVENTION

It is a primary object of the present invention to provide a coding system comprising a method and apparatus for producing a (0,4) runlength limited rate 8B/10B code.

It is a further object to provide such a coding system wherein the code produced is DC balanced and capable of operating near the theoretical performance limits for an 8B/10B code. This means the code is near optimum for run length and digital sum variation for an 8B/10B code.

It is another object of the invention to provide such a coding system wherein each 8 bit input block is broken into a 5 bit and a 3 bit sub-block and encoded separately while maintaining both DC balance and runlength constraints across all block and sub-block boundaries.

It is another object of the invention to provide such a coding system wherein the coding hardware performs bit encoding, disparity, and complementation determinations in parallel to minimize encoding time and logic levels.

It is yet another object of the invention to provide such a coding system wherein the above logic, disparity, and complementation determinations are logically combined with the uncoded data bits to provide a coded sub-block in a minimum number of logic levels.

It is yet another object of the present coding system to provide a plurality of special purpose control characters such as commas, delimiters, idle characters, etc. by using the extra bits in the coded blocks whereby the special characters may be readily distinguished from data, while at the same time maintaining the DC balance and run length limitations in such characters.

The objects, features and advantages of the present invention are realized by utilizing a (0,4) run length limited rate 8B/10B code which, although somewhat less efficient than for example a rate 5B/6B code, nevertheless has a number of other better coding features and transmission parameters in the code. A more serious objection in the past to 8B/10B codes has traditionally been the complexity of the coder and decoder circuits.

The coding system set forth herein, as embodied in the disclosed method and apparatus, substantially alleviates the problem of coder/decoder complexity by partitioning the 8 bit blocks to be encoded into sub-blocks, specifically 5B/6B and 3B/4B blocks. Coders for these blocks interact logically to provide a 8B/10B code with excellent AC coupling characteristics and timing properties.

DESCRIPTION OF THE PREFERRED EMBODIMENT

Figure 1:
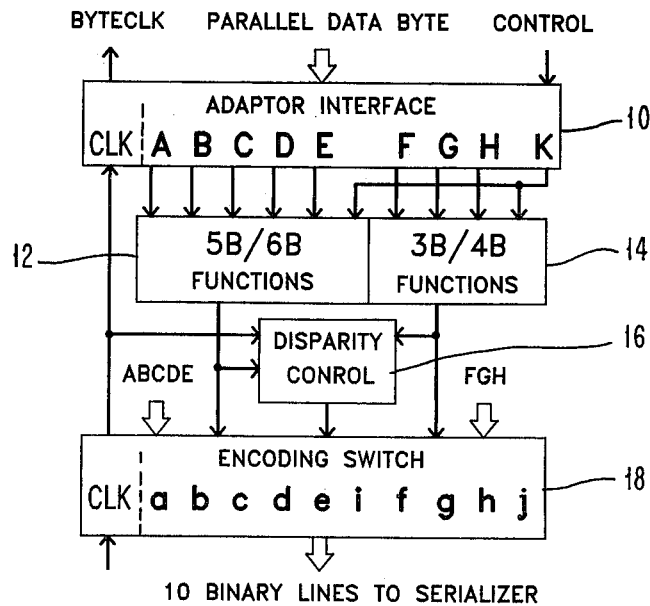
FIG. 1 comprises a functional block diagram and data flow diagram for the coding system of the present invention.

General Discussion of the Coding Concepts and Design

As noted above, the stream of signals transmitted down a channel must be constrained so that enough transitions for timing recovery and little or no DC spectral components are present.

A measure of the energy at and near DC is the digital sum variation or DSV, which is obtained as follows. Each channel symbol (corresponding to a possible signal waveform during a baud) is assigned an algebraic value corresponding to its DC component. The DSV is defined as the variation in the running sum of the encoded data stream, i.e., the maximum minus the minimum value. For a binary or two level code, the one and zero bits are generally assigned values of $+1$ and $-1$ respectively. In the following, the maximum DSV will be denoted by the symbol L. Note, that the number of levels in the running sum is $L+1$. This is because both the maximum and minimum value are included (see FIG. 2).

In the present usage, run length is defined as the number of identical contiguous symbols which appear in the signal stream. For a binary code, the run length is the number of contiguous ones or zeros after encoding. What is of interest is the shortest (X) and the longest (Y) run lengths that appear. These two parameters are often given in the form (d,k) where $d=X-1$ and $k=Y-1$. The (d,k) representation gives the minimum (d) and maximum (k) number of bauds between unequal symbols. For an (0,3) code, for example, any symbol can be followed by no more than 3 contiguous identical symbols, for a maximum run length of 4. Codes designed for digital transmission usually have a parameter d of zero. The preferred codes for magnetic recording, on the other hand, have usually a parameter value d of 1 or greater, i.e., the minimum spacing between transitions is longer than a baud interval.

A basic principle embodied in the present invention is the partitioned block format. Due to reasons connected with error propagation, it is desirable to encode 8 bits at a time in code words of 10 bits to be transmitted, rather than 4 into 5. However, a nonlinear encoding of eight bits such as that described here presents difficulties in implementation, as well as the likelihood that a single error in detection will result in eight erroneously decoded data bits. These problems are solved via the partitioned block format: that is, the eight bits are encoded using coders producing less than 10 bit outputs. These coders interact so as to yield the desired code words. The result is a coder whose coding rate, complexity and error propagation are near the theoretical limits, and which has ancillary benefits in flexibility of adaptation to various situations. Other partitions beside the 5/6, ⅜ were considered in the design proven, but all appear to have disadvantages in error propagation and other criteria.

Description of the Disclosed 8B/10B Coding System

The following is a detailed description of the 8B/10B (0,4) code of the present invention with a DSV=6, which can be implemented with a modest amount of circuitry. The code is near the theoretical limits in terms of the commonly used criteria of Digital Sum Variation and maximum run length. Beyond the 256 code points needed for the encoding of a byte of data, the code, as disclosed contains also 3 synchronizing and 9 other special characters for use as frame delimiters and other control functions. If one includes the 12 special characters, the coding efficiency amounts to 0.8066 bits per baud:

$$\{LOG_2 (256+12)\}: \{LOG_2 1024\} = 0.8066$$

The encoder implementation assumes a parallel byte wide interface for data. A serial implementation is possible; however, this code is primarily intended for links operating at or above a few Mbit/sec, where there is incentive to minimize the number of logic circuits operating at the baud rate and to separate out as many lower speed circuits as possible for implementation in a denser, lower cost technology. The encoder and decoder circuits operate at the byte rate.

Referring briefly to FIG. 1 the overall functional organization of the encoder of the present invention is shown. The FIGURE also represents in essence a data flow chart for the encoding sytem. It is assumed that 8 bit bytes of parallel data enter the adaptor interface 10 at the top. It will be well understood that the data could be provided on parallel lines from an originating system or could be the output of a serial to parallel converter which accumulates data in 8 bit blocks and transfers it to the adaptor interface 10 in parallel. The 8 input data bits are clearly shown as ABCDE and FGH. Control bit K as shown will indicate special characters. The first 5 data bits ABCDE are gated into the logical function encoder 12 for the 5 bit sub-block and bits FGH are gated to functional encoder 14 for the 3 bit sub-block. The logical functions these blocks perform is set forth in the "classification" column of Table I labelled "bit encoding." The disparity control 16 performs the logical determinations specified in the "disparity" classification column of Table I. The outputs of blocks 12, 14 and 16 together with the 5 bit and the 3 bit data ABCDE and FGH respectively proceed to the encoding switch 18 where the final encoding operation takes place to produce the encoded sub-blocks abcdei and fghj. A description of the logical operations and circuitry for performing the 'bit encoding,' the 'disparity' determinations and the complementation decisions will be set forth more fully subsequently.

To summarize the communications Adapter interface 10 consists of the 8 data lines ABCDEFGH (note the upper case notation), a control line K, and a clock line CLK operating at the byte rate. The control line K indicates whether the lines A through H represent data or control information such as frame delimiters and a limited set of other special characters.

For encoding purposes, each incoming byte is partitioned into two sub-blocks. The 5 binary lines ABCDE (see FIG. 1) are encoded into the 6 binary lines abcdei (note the lower case notation), following the directions of the 5B/6B logic functions and the disparity control. Similarly, the three bits FGH are encoded into fghj. The 5B/6B and 3B/4B encoders operate to a large extent independently of each other.

The disparity of a block of a data is the difference between the number of ones and zeros in the block; positive and negative disparity numbers refer to an excess of ones or zeros respectively. For both the 6B=abcdei and 4B=fghj sub-blocks the permitted disparity is either zero or +2 or −2. As an example, a 6B sub-block containing 4 ones and 2 zeros has a disparity of +2. The coding rules require that the polarity of non-zero disparity blocks must alternate. For this purpose, there is no distinction made between 6B and 4B sub-blocks.

Non-zero disparity code points are assigned in complementary pairs to a single data point. The encoding functions generate one of them; if it violates the alternating polarity rule, the complete sub-block is inverted in the encoding switch to conform with the required disparity.

Disparity and polarity determination in the 6B encoder is followed by the corresponding operations of the 4B encoder, then the running disparity parameter is passed along for encoding of the next byte.

The majority of the coded sub-blocks are of zero disparity and are, with some exceptions, independent of the running disparity, i.e., they do not have a complementary alternate since they don't need one.

The 10 encoded lines abcdeifghj would normally interface with a serializer for subsequent transmission. The 'a' bit must be transmitted first and 'j' last.

The 8B/10B encoding is accomplished by encoding the bits ABCDE of the input byte into the line digits abcdei in a 5B/6B encoder following the coding plan and rules specified Table I, and the bits FGH in a 3B/4B encoder into the line digits fghj following the rules of Table II.

Referring now to Table I, the first column headed by NAME gives the 32 decimal equivalents for the input lines ABCDE, assuming A is the low order bit and E the high order bit. For regular data (D.x) the line K must be held at zero. A few code points can be part of special characters, which are recognizable as other than data; such code points are named D/K.x or K.x and have an x or 1 in column K. To encode special characters the K line must be one. The code points designated K can only be special characters while the ones designated D/K can be either depending on the setting of the K line.

In the CLASSIFICATION column, the entry L04 means that there are no ones but 4 zeros in ABCD; L13 means that there is 1 one and 3 zeros in ABCD, etc. The letter L indicates that this logic function or classification is part of the 5B/6B encoder. Analogous functions are defined for the 6B/5B decoder in Table IV and labelled P. An accent to the right of a symbol is used to represent complementation; thus E' means the complement of E.

In the column under the left 'abcdei' heading there are all the code points listed which are generated directly by the 5B/6B logic functions from the ABCDE inputs. The coding table was designed so that a minimal number of bits need to be changed on passing through the encoder, and such that the changes which are required, can be classified into a few groups applicable to several code points. All the bits in Table I, in the "abcdei" column which require action by the 5B/6B logic functions other than complementation of the complete sub-block, are in bold type, assuming that the extra digit i is normally added with a value of 0.

When the inputs meet the logical conditions listed in the left sub-column under the column marked CLASSIFICATIONS, BIT ENC, then the bold type bits are changed to the values shown in the left abcdei column; e.g., if L04 holds, then the b and c digits are forced to ones as shown for D.0 and D.16. The second entry in the CLASSISFICATION, BIT ENC. column for D.16 (L04.E) and D.31 (L40.E) applies to the i digit. For lines with no classification entry, the ABCDE bits translate unchanged into abcde and the added i bit is a zero.

It should be understood that the logic statements or definitions pertaining to the various data input configurations as specified in the two columns marked 'bit encoding' and 'disparity' represent the logic which the logic function circuitry of blocks 12 and 14 and the disparity control circuitry of block 16 (all on FIG. 1) must perform. The actual logic operations are perform formed in the detailed logic circuitry set forth in FIGS. 3, 4, 5 and 6 which are all described more fully subsequently. In these tables the data bits or values are clearly marked and defined by i.e., ABC or their complements A'B'C' as well as the particular logic functions wherein a. is an AND function and a +denotes an OR function, etc. The same defintions apply also to the logic functions and explicit circuitry set forth in Table II, IV and V.

Figure 2:
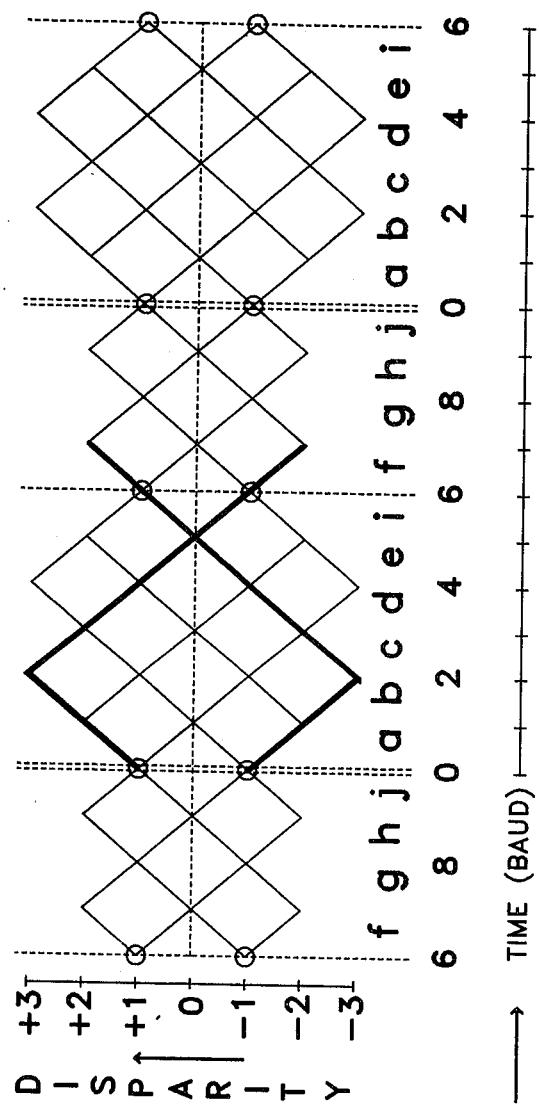
FIG. 2 is a disparity versus time graph for the coding system of the present invention illustrating the DC balance maintained during the coding processing.

The alternate abcdei column to the right of Table I shows the complementary form for those ABCDE inputs which have an alternate form. Individual 6B (and 4B) sub-blocks are complemented in conformity with the disparity rules. At all sub-block boundaries the running disparity is either +1 or −1 and never zero (see FIG. 2). FIG. 2 is described more fully subsequently.

The column D-1 indicates the required running disparity for entry of the adjacent sub-block to the right (i.e., the next sub-block to be coded). An x in the D-1 column means that D-1 can be +or −. Stated differently the disparity of the current sub-block is zero. In this code the polarity of the running disparity at sub-block boundaries is identical to the polarity of the most recent non-zero disparity block.

As an example for encoding of the first line D.0 of Table I: If the running disparity matches D-1 = +, then the output to the encoder will be 011000; otherwise the entire sub-block is complemented to 100111.

The D0 column indicates the disparity of the encoded sub-block to the left (the sub-block being coded), which is either 0, +2 or −2. The disparities (i.e., columns D-1 and D0) for the "alternate" code points on the right side of Table I and II are exact complements of those to their left and are not shown in the Tables.

Similar to bit encoding, the encoder hardware determines directly from the ABCDE and K inputs the disparities of a sub-block without really counting ones and zeros. The respective logic functions performed for classification of code words in terms of disparity requirements are shown in the separate column in Table I marked "Disparity."

In Table I, line D.7, a pair of zero disparity 6B sub-blocks is assigned to a single data point with an entry disparity constraint similar to those applicable to non-zero dispairty sub-blocks. This coding feature reduces the maximum digital sum variation from 8 to 6 and, combined with an analogue rule in the 3B/4B encoder for D/K.x.3 of Table II, (explained further subsequently), eliminates all sequences of run length 6 and most of those with run length 5.

The technique of assigning a pair of complementary zero disparity sub-blocks to a single code point is also used uniformly for all 4B sub-blocks which are part of a special character as shown in Tables II and III for the special characters designated as K.28.1, K.28.2, K.28.3, K.28.5 and K.28.6.

Table II follows the conventions and notations of Table I. In Table II some lines have 2 entries in the column for the classification of disparity; the left classification refers to the entry disparity D-1 and the right one to D0.

The encoding of D.x.P7 (Primary 7) and D/K.y.A7 (Alternate 7) requires an explanation. The D/K.y.A7 code point was introduced to eliminate the run length 5 sequence in digits eifgh. The A7 code replaces the P7 encoding whenever:

[(D−1 = +) AND (e=i=0)]OR [(D−1 = −) AND (e=i=1)]OR (K=1)

Note, that FGH=111 is always translated into fghj=0111 or the complement if K=1.

The D/K.y.A7 encoding can generate a run length 5 sequence across the trailing character boundary in the ghjab bits; however, this sequence is preceded by a run length of only 1 in digit f, with one exception: If the leading character is the special character K.28.7, a run length 5 sequence across the trailing character boundary is preceded by another run length 5 sequence in cdeif. For the significance of these distinctions see the following discussion of special characters.

The zero-disparity 4B sub-blocks of K.28.1, K.28.2, K.28.5 and K.28.6 are handled similarly to D/K.x.3 with respect to complementation in order to generate some special characters with byte synchronizing or comma properties. The first number (28) is the decimal equivalent for abcde, the second number is for the decimal equivalent of bits fgh, x is for don't cares.

Special characters are defined here as extra code points beyond the 256 needed to encode a byte of data. They can exist because of the 2 extra bits inserted by the encoding process (i.e., 8 bits expanded to 10 bits).

They are generally used to establish byte synchronization, to mark the start and end of frames and sometimes to signal control functions such as abort, reset, shut off, idle and link diagnostics. The set of 12 special characters shown in Table III can be generated by the coding rules defined in Table I and II. This set of special characters includes the most useful ones from a larger set which could be defined, if needed. They all comply with the general coding constraints of a maximum run length of 5 and a maximum digital sum variation of 6.

The first group of 8 special characters K.28.x, Table III, can be recognized as other than data by observing that abcdei=001111 or 110000. In data we have never c=d=e=i.

The second group of 4 special characters K.x.7, Table III, is characterized by eifghj=101000 or 010111. The distinction from data is the encoding of FGH into A7 (0111 or 1000), where according to Table II, P7 (1110 or 0001) would be used for data, for valid data fghj=1000 requires that ei=00 and fghj=0111 must be preceded by ei=11. A comma indicates the proper byte boundaries and can be used for instantaneous acquisition or verification of byte synchronization. To be useful, the comma sequence must be singular and occur with a uniform alignment relative to the byte boundaries; in the absence of errors the comma must not occur in any other bit positions neither within characters nor through overlap between characters. Three characters in this code (K.28.1, K.28.5, K28.7) have comma properties; they are marked with an asterisk in Table III and the singular sequence is printed in bold type. These three characters are also the most suitable delimiters to mark the start and end of a frame.

The singular comma in this code is a sequence of run length 2 or more ending with digit b followed by a run length 5 sequence; where this second sequence is not permitted to be the RL≧2 sequence of another comma; in other words, if two or more RL≧2/RL5 sequences overlap, only the first, third or any odd numbered one is recognized as a comma. This rule is necessary, because in some situations the K.28.7 comma is followed by another run length 5 sequence in digits ghjab.

A sequence of contiguous K.28.7 characters would generate alternating RL=5 sequences of ones and zeros, which is not useful for character synchronization and is poor for bit clock synchronization. For this reason, no adjacent K.28.7 characters are allowed.

Despite the restrictions placed on it, the K.28.7 comma is often preferred over the other two, because in the synchronized state no single error can generate a valid K.28.7 from data. To get the same level of immunity from noise with the other two commas one can define the frame structure so the delimiters are always followed by a 6B sub-block with non-zero disparity.

The parameters used in the present description to describe the spectral properties of the code are the digital sum variation, the disparity, and the run length.

The maximum DSV between arbitrary points in this code is 6. Sometimes the DSV is quoted with reference to specific bit positions, such as the end of a character, and a lower figure usually results. For the code described here the maximum DSV between any two i/f or j/a bit boundaries is 2.

As described previously, the term disparity is used here to designate the excess of one bits over zero bits in a defined block of digits or the instantaneous deviation from the long-term average value of the running digital sum. All 6B and 4B sub-blocks individually and the complete 10-baud characters have a disparity of either 0 or +2, i.e., each valid character in the 10B alphabet has either 5 ones and 5 zeros, or 6 ones and 4 zeros, or 4 ones and 6 zeros.

It is instructive to plot the disparity as a function of time or baud intervals as is done in FIG. 2, where each one bit is marked by a line segment extending over 1 baud interval and rising at a 45° angle; conversely, a zero bit is represented by a falling line. As an example, starting at the circled +1 disparity value on the left most j/a bit boundary, a 110100 digit pattern would lead along the upper contour to disparity =+1 at the i/f bit boundary. Alternatively, starting from the same point, a pattern such as, for example, 001010 (abcdei) leads to a disparity of −1 at the i/f bit boundary. All data characters and special characters of Tables I, II and III are represented in FIG. 2. The bold lines represent the comma sequence.

From the diagram it is immediately evident that the maximum DSV between arbitrary points is 6. Since the disparity is bounded, the code is free of any DC component (i.e., DC balanced).

FIG. 2 also reveals some of the dynamics of the disparity parameter, i.e., how long it can remain at extreme values. Thus, the disparity of this code cannot exceed |2| for longer than 2 baud intervals; similarly, it cannot remain above |1| in excess of 6 baud intervals.

On the other hand, the disparity can remain non-zero for the duration of a complete frame minus 10 baud intervals. It is readily seen from FIG. 2 just what the necessary conditions for this are. If, for example, the data portion of the frame starts with a Disparity of +1 and throughout the frame (abcdei=110100, OR 101010, OR 101100) AND (fghj=1010)

the diparity will not return to zero until the ending delimiter; the delimiters as described in 3.2.3.1 all contain at least one nonzero-disparity sub-block and cross the zero disparity line in the center of the character between the e and i bits, as shown by the bold lines. The dynamics of the disparity parameter are relevant to the design of the AC circuits associated with the transmitter and receiver.

The run length was defined previously, as the number of contiguous identical symbols; since the code at hand is a binary or two-level code, the run length is simply the number of contiguous ones or zeros after encoding. What is of interest is the shortest and the longest run length, which are one and five in this code.

FIG. 2 also shows, which bit positions could potentially be part of a run length 5 sequence. Potential RL=5 sequences start with bit positions c, e, g and j. However, inspection of Table I shows that the 6B alphabet does not include any code points for which a=b=c=d and that c=d=e=i is confined to the K.28.x special characters; these constraints render impossible any RL=5 sequence starting with j and limit those starting with c to the comma sequences listed in Table III. The RL=5 data sequence starting with e is eliminated through the alternate code point D.x.A7 of Table II, which in turn is the sole generator of the RL=5 sequence staritng with g; note, however, that this sequence is always preceded by RL=1 except when overlapping with the K.28.7 comma. Single errors or short error bursts in the encoded line digits of any block code can generate a longer error burst in the decoded message. For the 8B/10B code proposed here the effects of line digit errors are always confined to the 6B or 4B sub-blocks in which they occur and generate error bursts no longer than 5 or 3, respectively, from a single line digit error. This derives from the fact, that each 6B or 4B sub-block is uniquely decodable on the basis of just the values belonging to that sub-block and without any reference to disparity or other extraneous parameters. The only exceptions are the special characters K.28.1, K.28.2, K.28.5, K.28.6, for which the decoding of the fghi bits is dependent on the abcdei bits; however, adverse effects from this are limited since special characters usually appear only at specified slots with respect to the frame boundaries and often are not covered by the CRC.

The inherent redundancy of the code can be used for error detection. Errors in the line digits will often generate invalid characters or violations of the disparity rules. Simple circuits (not shown in this application) can monitor for such irregularities. Generally, whenever the number of erroneous ones in the line digits of a frame is not equal to the number of erroneous zeros, it will be detected as a code violation and in many of the other cases as well.

From the previous section, one can conclude, that the CRC used with this code should detect at least any combination of double errors in the line digits, if it is to make a significant impact on the combined guaranteed level of error detection. A double error in the line digits can generate in the worst case 2 error bursts of length 5 each after decoding. Fire codes are well suited for this application. Peterson and Brown teach in "Cyclic Codes for Error Detection," Proceedings IRE, Vol. 49, pp. 228-235, January 1961, Theorem 8, how to specify generator polynomials for cyclic codes with the capability to detect two burst of errors. With 16 check bits two bursts of combined length ten or less can be detected in frames as long as 142 bytes; 24 check bits can accomplish the same thing for frames as long as 36862 bytes. Other intermediate options are available, e.g., there is a polynomial of degree 24 which can detect two bursts of combined length sixteen in frames up to 958 bytes long.

A CRC can generally detect any single error burst of a length, which does not exceed the number of check bits. With the 8B/10B code described here, any single error burst in the encoded digits of length 15 or less cannot grow to more than 16 bits after decoding. Similarly error bursts of length 25 and 35 in the encoded bits translate into error bursts no longer than 24 and 32 bits, respectively, after decoding.

In summary one can conclude, that for all frame lengths of practical interest a 24 bits or longer Fire code combined with the inherent error detection capability of the 8B/10B code can detect any three errors in the line digits, provided the beginning and end of the frame have been correctly established.

An 8B/10B encoder, serializer, deserializer and decoder thave been built and operated as part of an experimental 200 Mbaud fiber optic link. The circuit diagrams shown in FIGS. 3-8 and 10-13 include some slight streamlining changes for the purpose of clarity. The Tables I, II and III should be referred to for details of the more fundamental logic. The plus and minus signs associated with the line names of the logic diagrams refer to the more positive or more negative line levels, respectively; e.g., +L13 in FIG. 3, is at the more positive level, if L13 is true; −B is at the more negtaive level, if B=1.

The encoder and decoder have been implemented with MECL 10000 Series circuits from Motorola Corp. All flip-flops shown are of the positive edge triggered type.

Figure 8:
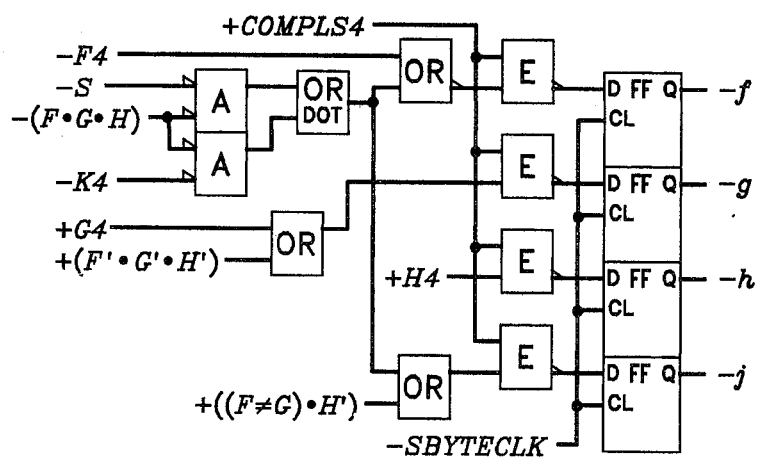
FIG. 8 comprises a logical schematic diagram of the 3B/4B encoder sub-block.
Figure 9:
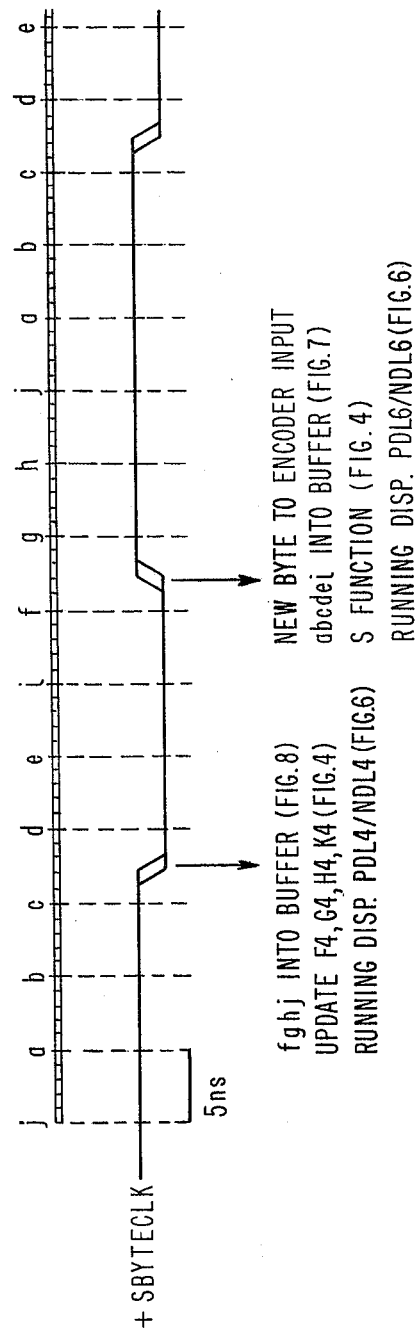
FIG. 9 comprises a timing diagram for the encoder clock.

The encoder is clocked by a byte rate clock derived from the transmitter (shown in FIG. 9). The byteclock (+SBYTECLK, S for Sender) is also passed on to the data source buffer, which responds after each positive clock transition with a new byte ABCDEFGH K on 15 parallel lines labelled +A, −A, +B, −B, +C, −C, +D, −D, +E, −E, +F, +G, +H, +K, −K. The encoded bytes are delivered to the output buffers in FIGS. 7 and 8. The lines −a, −b, −c, −d, −e, −i are updated after each positive transition of the +SBYTECLK (FIG. 7), the lines −f, −g, −h, −j after positive transitions of the −SBYTECLK (FIG. 8); this staggered transfer is possible because of the partitioned structure of the code.

Figure 3:
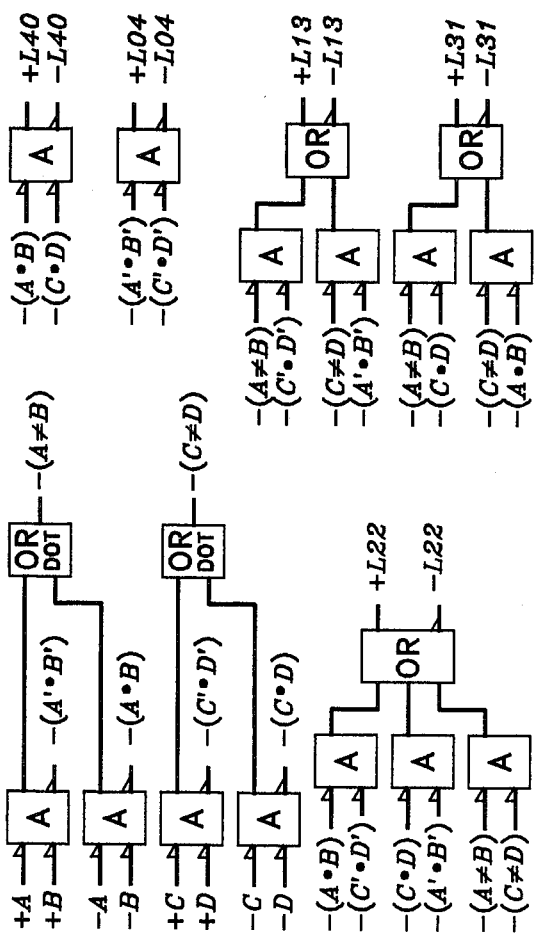
FIG. 3 comprises a logical schematic diagram which performs the determination of the 5B/6B "Classification: L functions" in the encoder.

The circuitry of FIG. 3, performs the generation of some of the basic classifications of Table I (Encoder: L Functions), from the encoder inputs. For an explanation of the imput and output notations refer to the previous description of Table I. For a detailed description of the logic convention utilized in these FIGURES reference should be specifically made to an article entitled "Documentation Standards Clarify Design," by John F. Wakerly, in Computer Design, February 1977, pages 75-85 (specifically see page 77). This article generally discusses the use of dot inputs on various logic circuit devices and also the use of positive and negative inputs for certain logic design applications. Also see "1981 Supplement of the TTL Data Book for Design Engineers," second edition, published by Texas Instruments Corporation, from pages 321-325. The reference extends the discussion in the reference set forth above and indicates the use of the arrows on inputs and outputs as a substitute for the above described dots on the inputs and outputs where essentially complementary or negative value inputs and outputs are required for design purposes.

Figure 4:
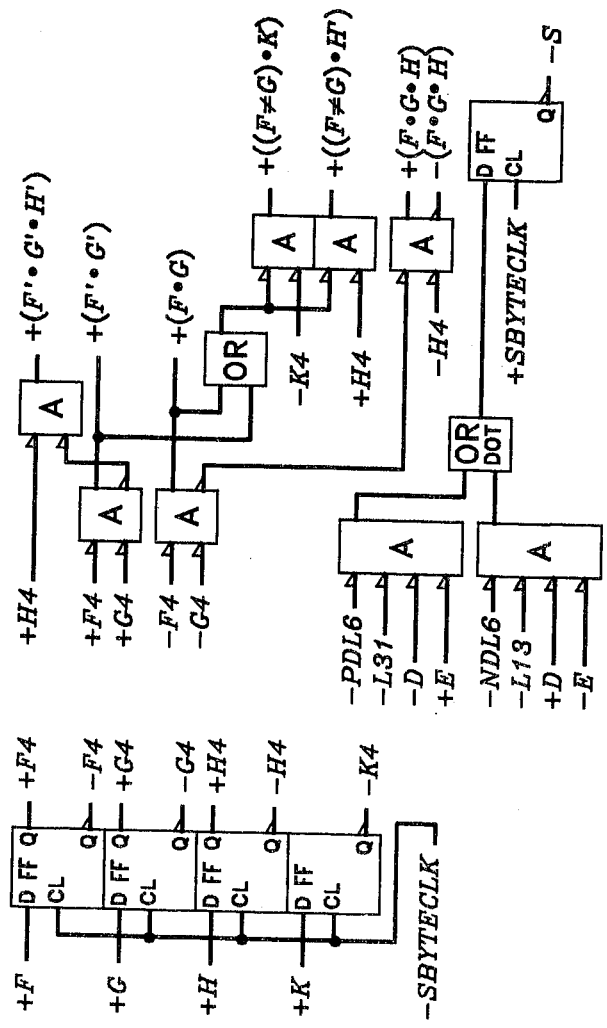
FIG. 4 comprises the logical schematic diagram of the circuitry which computes the 3B/4B "Classification and the S function" in the encoder.

The circuits of FIG. 4 generate the classifications of Table II. The F, G, H and K inputs are buffered. −PDL6 or −NDL6 is at the down level, if the running disparity as seen on the transmission line following the i bit of the 6B sub-block is positive or negative, respectively, as illustrated in FIG. 2. PDL6 and NDL6 are generated in FIG. 6. It should be noted that the number 4 appearing with certain of the bit values (F4, G4, H4, K4) distinguishes the output of the 4 buffers from their inputs and are valid during 3B/4B encoding.

Figure 5:
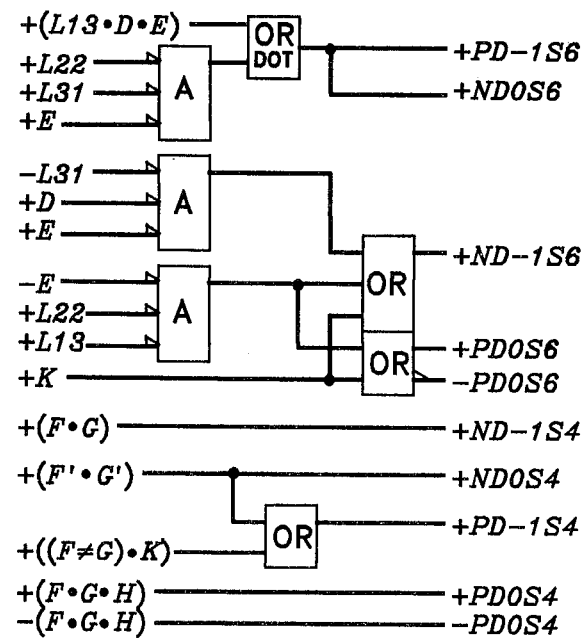
FIG. 5 is a logical schematic diagram of the circuitry which computes the "Disparity" Classifications in the encoder.

The circuitry of FIG. 5 implements the disparity classifications of both Tables I and II. All inputs are from FIG. 3 and 4 or the data source, except for (L13.D.E) which can be found in FIG. 7. The mnemonics for the outputs are as follows: P for Positive, N for Negative, S for Sender as a distinction from analogue functions labelled R in the decoder at the receiving end; D-1 and D0 refer to the respective columns in Table I and II; the number 6 associates a function with 5B/6B encoding and Table I, the number of 4 with 3B/4B encoding and Table II. As examples, +PD-1S6 is at the up level for any input which has a +sign in the D-1 column of Table I, +ND0S4 is at the up level for any input with a minus sign in the D0 column of Table II.

Figure 6:
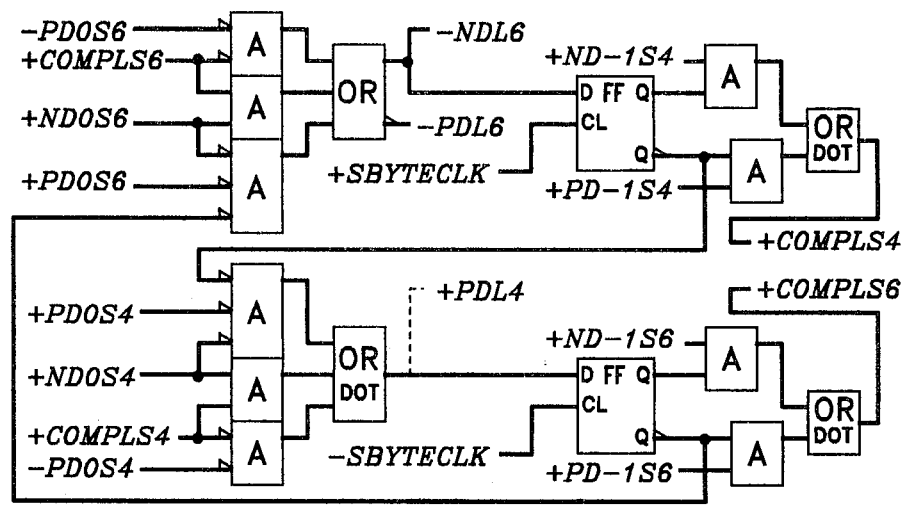
FIG. 6 comprises a logical schematic diagram of the circuitry which performs the control of Complementation in the encoder.

The upper flip-flop in FIG. 6 keeps track of the running disparity at the end of the i bit and the lower flip-flop does the same for the j bit. The gates to the right make the decision, whether the alternate, complemented code points of Table I and II apply, on the basis of the running disparity and the D-1 entry disparity classifications of FIG. 5. The gates to the left determine how to update the flip-flops taking into account the D0 disparity of the sub-block being encoded, complementation and the running disparity at the end of the previous sub-block. +PDL4 is at the up level for a positive running disparity at the end of the j bit. The 2 flip-flops shown in FIG. 6 can be replaced by a single flip-flop, but this requires an additional clockline from the serializer, running at twice the byte rate.

Figure 7:
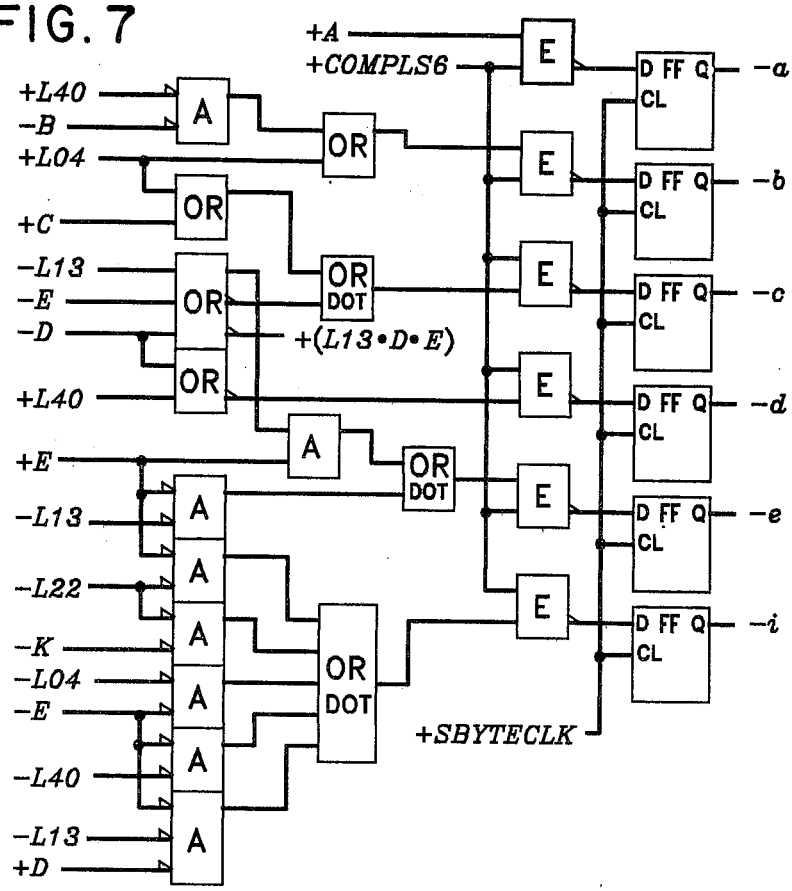
FIG. 7 is a logical schematic diagram of the 5B/6B encoder sub-block.

FIG. 7 performs the actual transformation of the 5 input bits ABCDE into the 6 abcdei output bits according to Table I. The gates to the left of the Exclusive-Or gates (E) bring about all the bold type bit changes of Table I.

The circuitry of FIG. 8 performs the 3B/4B encoding according to Table II.

FIG. 9 shows the timing relationship between the events in the encoder.

Logic Circuits for the Decoder (FIGS. 10–13)

The logical functions for the decoder and their classifications are defined in Table IV and V. For decoding, the i and the j bits are dropped and some of the remaining bits are complemented as indicated by bold 0 and 1 entries in the tables.

Figure 10:
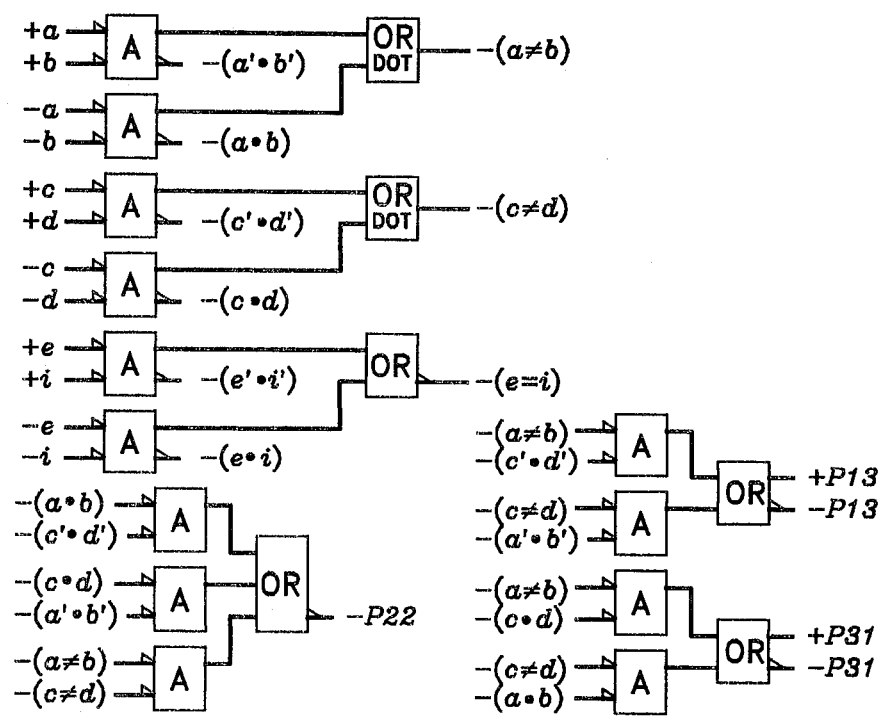
FIG. 10 comprises a logical schematic diagram for computing the P functions in the decoder.

The circuitry of FIG. 10 generates some fundamental logic functions for decoding, very similar to FIG. 3 for the encoder. The inputs for FIG. 10 are the encoded bits and are normally assembled at the receiving end of a transmission link by a Deserializer in a 10 bit wide parallel register (not shown).

Figure 11:
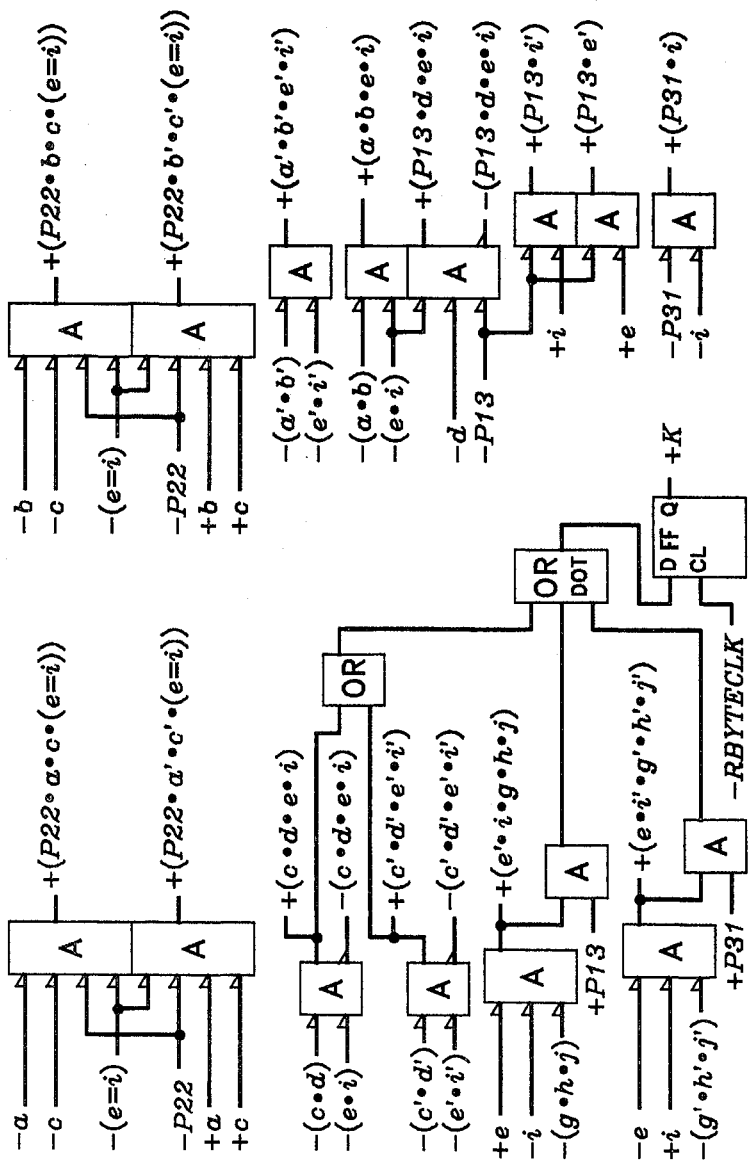
FIG. 11 is a logical schematic diagram of the circuitry for performing the 6B Classification and the K function computation in the decoder.

The circuitry of FIG. 11 executes the decoding classifications of Table IV and the K function, which indicates a special character, as stated in explicit form at the bottom of Table V. The two input functions dependent on the ghj bits are coming from FIG. 13.

Figure 12:
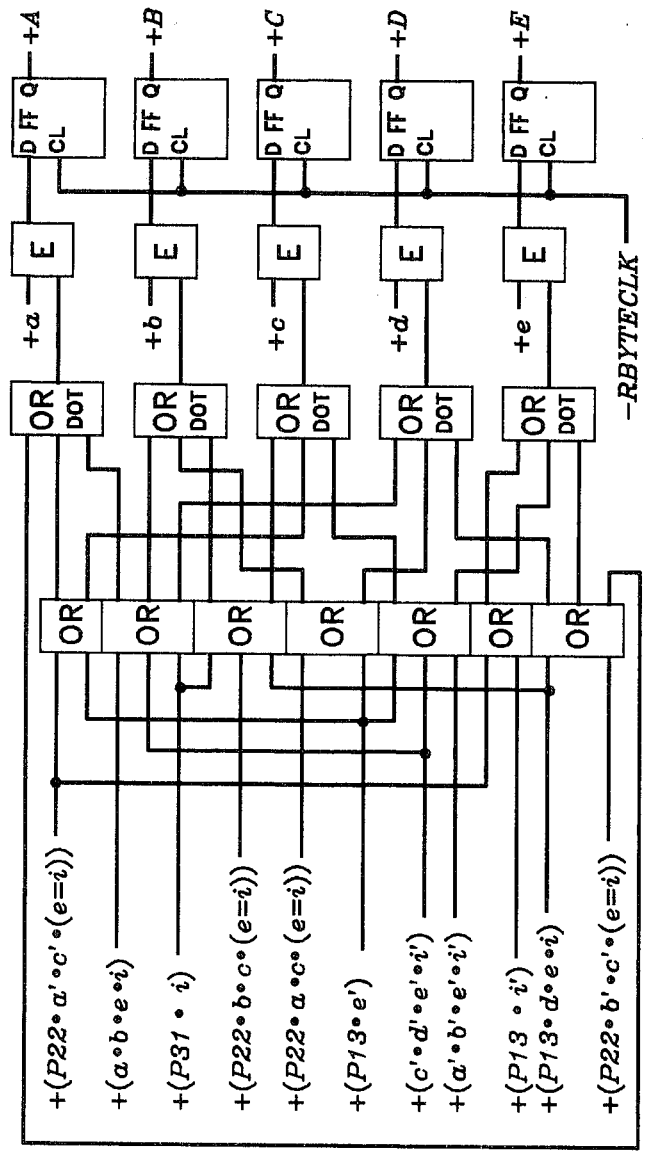
FIG. 12 comprises a logical schematic diagram of the circuitry which performs the 6B/5B decoding in the decoder.

The circuitry of FIG. 12 uses the logic functions generated in FIG. 11 for the actual 6B/5B decoding according to Table IV.

Figure 13:
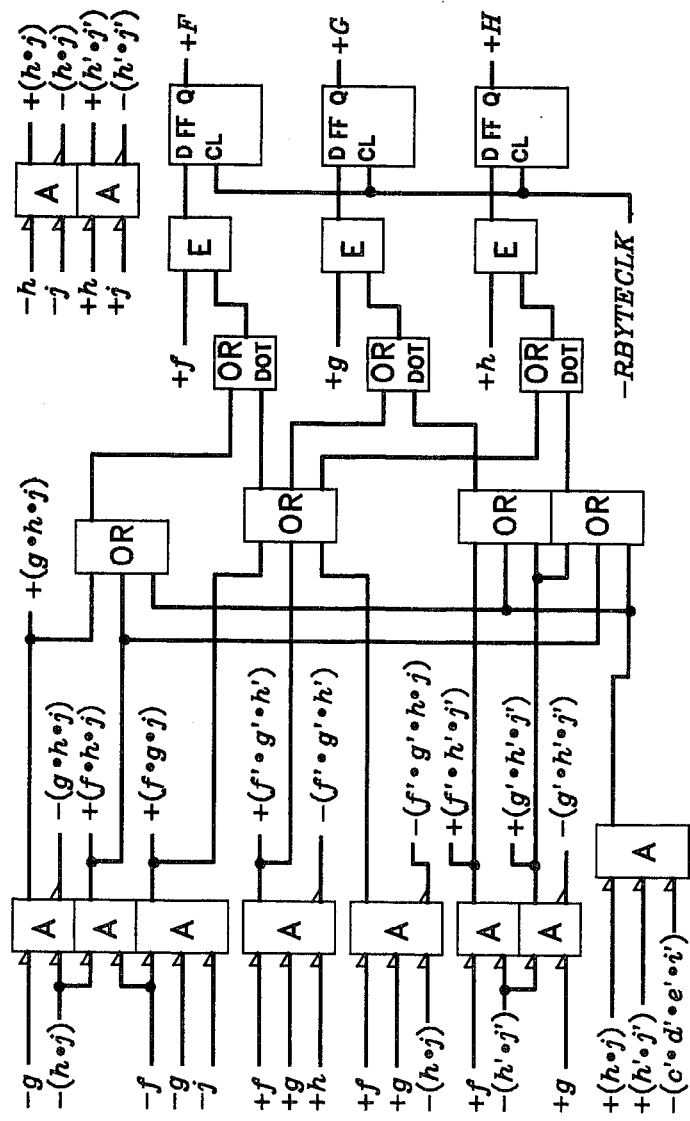
FIG. 13 comprises a logical schematic diagram of the circuitry which performs the 4B/3B decoding in the decoder.

The circuitry of FIG. 13 shows 4B/3B decoding according to Table V.

All the encoder and decoder circuits of FIGS. 3–8 and 10–13 are operating at the byte rate. An examination of the critical delay shows that the gate delays for the encoder and decoder should not exceed 1 baud interval.

In order to determine the circuit count, each exclusive OR gate (E) is counted as 3 gates. The gate count for the encoder (FIGS. 3–8) is 89 gates and 17 flip-flops; the decoder (FIGS. 16–19) requires 79 gates and 9 flip-flops. At low and medium data rates, where the gate delays are much less than a baud interval, some trivial design changes can significantly reduce the circuit count. For one, when the encoding and decoding delays are only a fraction of a byte time the 10 buffer flip-flops at the output of the decoder (FIGS. 11, 12, 13) and the encoder buffers of FIG. 7 or FIG. 8 or both, can be eliminated. Therefore, at the low end an encoder and decoder can be implemented with an appropriately lower circuit count.

It would be obvious to extend the teachings of the present coding system to other block sizes. Thus, if one wanted to encode 11 bits (8 data, 3 control) for example, using the teachings of the present coding concept, the input block would be broken into three sub-blocks to produce a 5B/6B, 3B/4B, 3B/4B parallel encoder obeying all of the present run length and disparity constraints.

INDUSTRIAL APPLICABILITY

While the intended application of the present coding system is primarily high speed computer links, it compares also favorably with Manchester coding in less demanding applications. For a given data rate the clock rate is reduced to 62.5% of the rate required for Manchester coding, while most of the important attributes of the Manchester code are preserved.

The main attraction of the present 8B/10B coding system compared to, for example, Manchester code for high speed fiber optic links is the reduction in the clock rate by a factor of 0.625, corresponding reductions in the required speed of the logic gates and the risetimes of the fiberoptic components. Depending on the specific data rate, the lower ratio of baud rate to byte rate helps single technology and single chip implementations of the logic functions associated with the communications adapter including coder/decoder, serializer, deserializer and clocks, resulting in some logic cost savings despite the higher circuit count. Manchester coding more often requires extra high speed circuits in the clocking and coding area.

The 8B/10B code of the present invention brings with it also a welcome improvement in the fiberoptic power budget by +1.6 dB for a PIN sensor with bipolar front end and by +3.5 dB with an FET front end resulting from the reduced bandwidth at the receiver amplifier. For LED links an additional 1.5 db gain or more in the power budget is realized, because the lower baud rate makes more powerful LED sources available. The LED device designer has to make a trade-off between power and bandwidth. Published diagrams, which are supported by theory and practical experience, show the log (Optical Power) versus log (Bandwidth) of LED devices as straight lines falling at the rate of about 7.5 db/decade for frequencies up to 140 MHz and almost twice as steep beyond that.

For typical copper wire transmission lines the attenuation increases proportionally to the square root of frequency in the area above 100kHz. Therefore, the lower baud rate of the 8B/10B code results in approximately 26% less attenuation than Manchester code. On the other hand, the increased run length results in more timing distortion, but adverse effects from this can be avoided to a great extent by signal shaping at the transmitter, by equalization and with better performing timing circuits.

Communication links using multipair cables and operating at several Mbit/s are often limited in distance by near end crosstalk (NEXT). The signal to NEXT margin is significantly improved by use of the 8B/10B code. Consider, as a point of reference a Manchester coded link with 30 dB attenuation measured at one half the baud rate (1 MHz for 1 Mbit/s Manchester). The attenuation of a 1 Mbit/s 8B/10B signal over the same link is reduced to 23.7 dB, increasing the available signal to NEXT margin by 6.3 dB through lower signal attenuation alone, if the distance is held constant.

An additional marginal improvement is realized through the reduction in the crosstalk noise, because the power spectrum of 8B/10B coded signals is shifted to lower frequencies. If the NEXT loss for a long line is $K_0$ dB at frequency $f_0$, it can be found for any other frequency, f, by $$\text{NEXT loss} = K_0 - 15 \log_{10} f/f_0 \text{ dB}$$

The shape of the power spectrum for the present 8B/10B signal is comparable to the Manchester spectrum, but frequencies are reduced by a factor of 0.625 and for random data the energy is shifted even more toward the lower frequencies. Therefore, it can be estimated conservatively that a reduction of the near end crosstalk of $$(15 \log 0.625) \text{ dB} = -3.06 \text{ dB}$$

results from the frequency reduction. The potential gain in signal to noise ratio over Manchester code is thus 9.36 dB, reduced slightly by higher residual distortion.

TABLE I

5B/6B ENCODING

| NAME | A B C D E | K | CLASSIFICATIONS BIT ENC. | DISPARITY | D−1 | a b c d e i | D0 | a b c d e i ALTERNATE |
|---|---|---|---|---|---|---|---|---|
| D.0    | 0 0 0 0 0 | 0 | L04       | L22'·L31'·E' | + | 0 1 1 0 0 0 | − | 1 0 0 1 1 1 |
| D.1    | 1 0 0 0 0 | 0 | L13·E'    | L22'·L31'·E' | + | 1 0 0 0 1 0 | − | 0 1 1 1 0 1 |
| D.2    | 0 1 0 0 0 | 0 | L13·E'    | L22'·L31'·E' | + | 0 1 0 0 1 0 | − | 1 0 1 1 0 1 |
| D.3    | 1 1 0 0 0 | 0 | L22·E'    |              | × | 1 1 0 0 0 1 | 0 |             |
| D.4    | 0 0 1 0 0 | 0 | L13·E'    | L22'·L31'·E' | + | 0 0 1 0 1 0 | − | 1 1 0 1 0 1 |
| D.5    | 1 0 1 0 0 | 0 | L22·E'    |              | × | 1 0 1 0 0 1 | 0 |             |
| D.6    | 0 1 1 0 0 | 0 | L22·E'    |              | × | 0 1 1 0 0 1 | 0 |             |
| D.7    | 1 1 1 0 0 | 0 |           | L31·D'·E'    | − | 1 1 1 0 0 0 | 0 | 0 0 0 1 1 1 |
| D.8    | 0 0 0 1 0 | 0 | L13·E'    | L22'·L31'·E' | + | 0 0 0 1 1 0 | − | 1 1 1 0 0 1 |
| D.9    | 1 0 0 1 0 | 0 | L22·E'    |              | × | 1 0 0 1 0 1 | 0 |             |
| D.10   | 0 1 0 1 0 | 0 | L22·E'    |              | × | 0 1 0 1 0 1 | 0 |             |
| D.11   | 1 1 0 1 0 | 0 |           |              | × | 1 1 0 1 0 0 | 0 |             |
| D.12   | 0 0 1 1 0 | 0 | L22·E'    |              | × | 0 0 1 1 0 1 | 0 |             |
| D.13   | 1 0 1 1 0 | 0 |           |              | × | 1 0 1 1 0 0 | 0 |             |
| D.14   | 0 1 1 1 0 | 0 |           |              | × | 0 1 1 1 0 0 | 0 |             |
| D.15   | 1 1 1 1 0 | 0 | L40       | L22'·L31'·E' | + | 1 0 1 0 0 0 | − | 0 1 0 1 1 1 |
| D.16   | 0 0 0 0 1 | 0 | L04, L04·E | L22'·L13'·E | − | 0 1 1 0 1 1 | + | 1 0 0 1 0 0 |
| D.17   | 1 0 0 0 1 | 0 | L13·D'·E  |              | × | 1 0 0 0 1 1 | 0 |             |
| D.18   | 0 1 0 0 1 | 0 | L13·D'·E  |              | × | 0 1 0 0 1 1 | 0 |             |
| D.19   | 1 1 0 0 1 | 0 |           |              | × | 1 1 0 0 1 1 | 0 |             |
| D.20   | 0 0 1 0 1 | 0 | L13·D'·E  |              | × | 0 0 1 0 1 1 | 0 |             |
| D.21   | 1 0 1 0 1 | 0 |           |              | × | 1 0 1 0 1 0 | 0 |             |
| D.22   | 0 1 1 0 1 | 0 |           |              | × | 0 1 1 0 1 0 | 0 |             |
| D/K.23 | 1 1 1 0 1 | × |           | L22'·L13'·E  | − | 1 1 1 0 1 0 | + | 0 0 0 1 0 1 |
| D.24   | 0 0 0 1 1 | 0 | L13·D·E   | L13·D·E      | + | 0 0 1 1 0 0 | − | 1 1 0 0 1 1 |
| D.25   | 1 0 0 1 1 | 0 |           |              | × | 1 0 0 1 1 0 | 0 |             |
| D.26   | 0 1 0 1 1 | 0 |           |              | × | 0 1 0 1 1 0 | 0 |             |
| D./K.27| 1 1 0 1 1 | × |           | L22'·L13'·E  | − | 1 1 0 1 1 0 | + | 0 0 1 0 0 1 |
| D.28   | 0 0 1 1 1 | 0 |           |              | × | 0 0 1 1 1 0 | 0 |             |
| D/K.29 | 1 0 1 1 1 | × |           | L22'·L13'·E  | − | 1 0 1 1 1 0 | + | 0 1 0 0 0 1 |
| D/K.30 | 0 1 1 1 1 | × |           | L22'·L13'·E  | − | 0 1 1 1 1 0 | + | 1 0 0 0 0 1 |
| D.31   | 1 1 1 1 1 | 0 | L40, L40·E | L22'·L13'·E | − | 1 0 1 0 1 1 | + | 0 1 0 1 0 0 |
| K.28   | 0 0 1 1 1 | 1 | L22·K     | K            | − | 0 0 1 1 1 1 | + | 1 1 0 0 0 0 |

TABLE II

3B/4B ENCODING

| NAME | F G H | K | CLASSIFICATIONS BIT ENC. | DISPARITY | D−1 | f g h j | D0 | f g h j ALTERNATE |
|---|---|---|---|---|---|---|---|---|
| D/K.x.0  | 0 0 0 | × | F'·G'·H'       | F'·G'        | + | 0 1 0 0 | − | 1 0 1 1 |
| D.x.1    | 1 0 0 | 0 | (F≠G)·H'       |              | × | 1 0 0 1 | 0 |         |
| D.x.2    | 0 1 0 | 0 | (F≠G)·H'       |              | × | 0 1 0 1 | 0 |         |
| D/K.x.3  | 1 1 0 | × |                | F·G          | − | 1 1 0 0 | 0 | 0 0 1 1 |
| D/K.x.4  | 0 0 1 | × |                | F'·G'        | + | 0 0 1 0 | − | 1 1 0 1 |
| D.x.5    | 1 0 1 | 0 |                |              | × | 1 0 1 0 | 0 |         |
| D.x.6    | 0 1 1 | 0 |                |              | × | 0 1 1 0 | 0 |         |
| D.x.P7   | 1 1 1 | 0 |                | F·G, F·G·H   | − | 1 1 1 0 | + | 0 0 0 1 |
| D/K.y.A7 | 1 1 1 | × | F·G·H·(S+K)    | F·G, F·G·H   | − | 0 1 1 1 | + | 1 0 0 0 |
|          |       |   | S = {e·i·(D−1=−)} + {e'·i'·(D−1=+)} | | | | | |
| K.28.1   | 1 0 0 | 1 | (F≠G)·H'       | (F≠G)·K      | + | 1 0 0 1 | 0 | 0 1 1 0 |
| K.28.2   | 0 1 0 | 1 | (F≠G)·H'       | (F≠G)·K      | + | 0 1 0 1 | 0 | 1 0 1 0 |
| K.28.5   | 1 0 1 | 1 |                | (F≠G)·K      | + | 1 0 1 0 | 0 | 0 1 0 1 |
| K.28.6   | 0 1 1 | 1 |                | (F≠G)·K      | + | 0 1 1 0 | 0 | 1 0 0 1 |

K.x RESTRICTED TO K.28
K.y RESTRICTED TO K.23, K.27, K.28, K.29, K.30

TABLE III

SPECIAL CHARACTERS (K = 1)

| NAME | A B C D E | F G H | K | D−1 | a b c d e i | f g h j | D0 | | D−1 | a b c d e i  f g h j ALTERNATE | D0 |
|---|---|---|---|---|---|---|---|---|---|---|---|
| K.28.0  | 0 0 1 1 1 | 0 0 0 | 1 | − | 0 0 1 1 1 1 | 0 1 0 0 | 0 | + | 1 1 0 0 0 0  1 0 1 1 | 0 |
| K.28.1* | 0 0 1 1 1 | 1 0 0 | 1 | − | 0 0 1 1 1 1 | 1 0 0 1 | + | + | 1 1 0 0 0 0  0 1 1 0 | − |
| K.28.2  | 0 0 1 1 1 | 0 1 0 | 1 | − | 0 0 1 1 1 1 | 0 1 0 1 | + | + | 1 1 0 0 0 0  1 0 1 0 | − |
| K.28.3  | 0 0 1 1 1 | 1 1 0 | 1 | − | 0 0 1 1 1 1 | 0 0 1 1 | + | + | 1 1 0 0 0 0  1 1 0 0 | − |
| K.28.4  | 0 0 1 1 1 | 0 0 1 | 1 | − | 0 0 1 1 1 1 | 0 0 1 0 | 0 | + | 1 1 0 0 0 0  1 1 0 1 | 0 |
| K.28.5* | 0 0 1 1 1 | 1 0 1 | 1 | − | 0 0 1 1 1 1 | 1 0 1 0 | + | + | 1 1 0 0 0 0  0 1 0 1 | − |
| K.28.6  | 0 0 1 1 1 | 0 1 1 | 1 | − | 0 0 1 1 1 1 | 0 1 1 0 | + | + | 1 1 0 0 0 0  1 0 0 1 | − |
| K.28.7* | 0 0 1 1 1 | 1 1 1 | 1 | − | 0 0 1 1 1 1 | 1 0 0 0 | 0 | + | 1 1 0 0 0 0  0 1 1 1 | 0 |

K.28.7 MUST NOT BE CONTIGUOUS TO ANOTHER K.28.7

| K.23.7 | 1 1 1 0 1 | 1 1 1 | 1 | − | 1 1 1 0 1 0 | 1 0 0 0 | 0 | + | 0 0 0 1 0 1  0 1 1 1 | 0 |
| K.27.7 | 1 1 0 1 1 | 1 1 1 | 1 | − | 1 1 0 1 1 0 | 1 0 0 0 | 0 | + | 0 0 1 0 0 1  0 1 1 1 | 0 |
| K.29.7 | 1 0 1 1 1 | 1 1 1 | 1 | − | 1 0 1 1 1 0 | 1 0 0 0 | 0 | + | 0 1 0 0 0 1  0 1 1 1 | 0 |

TABLE III-continued
SPECIAL CHARACTERS (K = 1)

| NAME | A B C D E | F G H | K | D−1 | a b c d e i | f g h j | D0 | | D−1 | a b c d e i | f g h j | D0 |
|---|---|---|---|---|---|---|---|---|---|---|---|---|
| | | | | | | | | | | ALTERNATE | | |
| K.30.7 | 0 1 1 1 1 | 1 1 1 | 1 | − | 0 1 1 1 1 0 | 1 0 0 0 | 0 | + | 1 0 0 0 0 1 | 0 1 1 1 | 0 |

*SINGULAR COMMA (FOR BYTE SYNCHRONIZATION)

TABLE IV
6B/5B DECODING

| NAME | a b c d e i | DECODING CLASS | A B C D E | K |
|---|---|---|---|---|
| D.0 | 0 1 1 0 0 0 | P22·b·c·(e=i) | 0 0 0 0 0 | 0 |
| D.0 | 1 0 0 1 1 1 | P22·b'·c'·(e=i) | 0 0 0 0 0 | 0 |
| D.1 | 1 0 0 0 1 0 | P13·i' | 1 0 0 0 0 | 0 |
| D.1 | 0 1 1 1 0 1 | P31·i | 1 0 0 0 0 | 0 |
| D.2 | 0 1 0 0 1 0 | P13·i' | 0 1 0 0 0 | 0 |
| D.2 | 1 0 1 1 0 1 | P31·i | 0 1 0 0 0 | 0 |
| D.3 | 1 1 0 0 0 1 | | 1 1 0 0 0 | 0 |
| D.4 | 0 0 1 0 1 0 | P13·i' | 0 0 1 0 0 | 0 |
| D.4 | 1 1 0 1 0 1 | P31·i | 0 0 1 0 0 | 0 |
| D.5 | 1 0 1 0 0 1 | | 1 0 1 0 0 | 0 |
| D.6 | 0 1 1 0 0 1 | | 0 1 1 0 0 | 0 |
| D.7 | 1 1 1 0 0 0 | | 1 1 1 0 0 | 0 |
| D.7 | 0 0 0 1 1 1 | P13·d·e·i | 1 1 1 0 0 | 0 |
| D.8 | 0 0 0 1 1 0 | P13·i' | 0 0 0 1 0 | 0 |
| D.8 | 1 1 1 0 0 1 | P31·i | 0 0 0 1 0 | 0 |
| D.9 | 1 0 0 1 0 1 | | 1 0 0 1 0 | 0 |
| D.10 | 0 1 0 1 0 1 | | 0 1 0 1 0 | 0 |
| D.11 | 1 1 0 1 0 0 | | 1 1 0 1 0 | 0 |
| D.12 | 0 0 1 1 0 1 | | 0 0 1 1 0 | 0 |
| D.13 | 1 0 1 1 0 0 | | 1 0 1 1 0 | 0 |
| D.14 | 0 1 1 1 0 0 | | 0 1 1 1 0 | 0 |
| D.15 | 1 0 1 0 0 0 | P22·a·c·(e=i) | 1 1 1 1 0 | 0 |
| D.15 | 0 1 0 1 1 1 | P22·a'·c'·(e=i) | 1 1 1 1 0 | 0 |
| D.16 | 0 1 1 0 1 1 | P22·b·c·(e=i) | 0 0 0 0 1 | 0 |
| D.16 | 1 0 0 1 0 0 | P22·b'·c'·(e=i) | 0 0 0 0 1 | 0 |
| D.17 | 1 0 0 0 1 1 | | 1 0 0 0 1 | 0 |
| D.18 | 0 1 0 0 1 1 | | 0 1 0 0 1 | 0 |
| D.19 | 1 1 0 0 1 0 | | 1 1 0 0 1 | 0 |
| D.20 | 0 0 1 0 1 1 | | 0 0 1 0 1 | 0 |
| D.21 | 1 0 1 0 1 0 | | 1 0 1 0 1 | 0 |
| D.22 | 0 1 1 0 1 0 | | 0 1 1 0 1 | 0 |
| D/K.23 | 1 1 1 0 1 0 | | 1 1 1 0 1 | x |
| D/K.23 | 0 0 0 1 0 1 | P13·e' | 1 1 1 0 1 | x |
| D.24 | 0 0 1 1 0 0 | a'·b'·e'·i' | 0 0 0 1 1 | 0 |
| D.24 | 1 1 0 0 1 1 | a·b·e·i | 0 0 0 1 1 | 0 |
| D.25 | 1 0 0 1 1 0 | | 1 0 0 1 1 | 0 |
| D.26 | 0 1 0 1 1 0 | | 0 1 0 1 1 | 0 |
| D/K.27 | 1 1 0 1 1 0 | | 1 1 0 1 1 | x |
| D/K.27 | 0 0 1 0 0 1 | P13·e' | 1 1 0 1 1 | x |
| D.28 | 0 0 1 1 1 0 | | 0 0 1 1 1 | 0 |
| K.28 | 0 0 1 1 1 1 | c·d·e·i | 0 0 1 1 1 | 1 |
| K.28 | 1 1 0 0 0 0 | c'·d'·e'·i' | 0 0 1 1 1 | 1 |
| D/K.29 | 1 0 1 1 1 0 | | 1 0 1 1 1 | x |
| D/K.29 | 0 1 0 0 0 1 | P13·e' | 1 0 1 1 1 | x |
| D/K.30 | 0 1 1 1 1 0 | | 0 1 1 1 1 | x |
| D/K.30 | 1 0 0 0 0 1 | P13·e' | 0 1 1 1 1 | x |
| D.31 | 1 0 1 0 1 1 | P22·a·c·(e=i) | 1 1 1 1 1 | 0 |
| D.31 | 0 1 0 1 0 0 | P22·a'·c'·(e=i) | 1 1 1 1 1 | 0 |

TABLE V
4B/3B DECODING, K FUNCTION

| NAME | f g h j | DECODING CLASS | F G H | K |
|---|---|---|---|---|
| D/K.x.0 | 0 1 0 0 | f'·h'·j' | 0 0 0 | x |
| D/K.x.0 | 1 0 1 1 | f·h·j | 0 0 0 | x |
| D/K.x.1 | 1 0 0 1 | | 1 0 0 | x |
| K.28.1 | 0 1 1 0 | c'·d'·e'·i'·(h≠j) | 1 0 0 | 1 |
| D/K.x.2 | 0 1 0 1 | | 0 1 0 | x |
| K.28.2 | 1 0 1 0 | c'·d'·e'·i'·(h≠j) | 0 1 0 | 1 |
| D/K.x.3 | 1 1 0 0 | | 1 1 0 | x |
| D/K.x.3 | 0 0 1 1 | f'·g'·h·j | 1 1 0 | x |
| D/K.x.4 | 0 0 1 0 | | 0 0 1 | x |
| D/K.x.4 | 1 1 0 1 | f·g·j | 0 0 1 | x |
| D/K.x.5 | 1 0 1 0 | | 1 0 1 | x |
| K.28.5 | 0 1 0 1 | c'·d'·e'·i'·(h≠j) | 1 0 1 | 1 |
| D/K.x.6 | 0 1 1 0 | | 0 1 1 | x |
| K.28.6 | 1 0 0 1 | c'·d'·e'·i'·(h≠j) | 0 1 1 | 1 |
| D.x.7 | 1 1 1 0 | | 1 1 1 | 0 |
| D.x.7 | 0 0 0 1 | f'·g'·h' | 1 1 1 | 0 |
| D/K.x.7 | 0 1 1 1 | g·h·j | 1 1 1 | x |
| D/K.x.7 | 1 0 0 0 | g'·h'·j' | 1 1 1 | x |

K = (c=d=e=i) OR (P13·e'·i·g·h·j) OR (P31·e·i'·g'·h'·j')

Having thus described our invention, what we claim as new, and desire to secure by Letters Patent is:

1. A method for producing a DC balanced (0,4) run length limited rate 8B/10B code from an unconstrained input data stream comprising a multiplicity of 8 bit data blocks, said method including partitioning the 8 bit block into two sub-blocks consisting of 5 and 3 contiguous bits, examining each sub-block to determine if any of the individual bits require alteration and altering predetermined bits based on said determination to produce an alternate code pattern, determining the disparity (D0) of the current output sub-block being coded, ascertaining the disparity (D−1) of the last non-zero sub-block coded and selecting a first code pattern as the current output sub-block for certain of the output sub-blocks if the last non-zero disparity in the output code pattern was of a first polarity, assigning the complement of said first code pattern if the last non-zero disparity was of the opposite polarity.

2. A coding method as set forth in claim 1, wherein the encoding of the 5 bit input data sub-block and the 3 bit input data sub-block is performed substantially concurrently.

3. A coding method as set forth in claim 2 including automatically adding an extra bit of a predetermined value to each input sub-block to form each output sub-block, said predetermined value being subject to change if it is determined that a predetermined code pattern in said current input sub-block requires changing said extra bit.

4. A coding method as set forth in claim 3 wherein said alternate code pattern is generated by controlling the complementation of individual bits of said input sub-block and said extra bit in accordance with the logical content thereof to alter same when necessary.

5. A coding method as set forth in claim 4 wherein the selection of the particular input bits to be complemented is accomplished by logically combining individual predetermined bits of said input data sub-block.

6. A coding method as set forth in claim 5 wherein the step of computing the disparity of a current sub-block includes the steps of performing a logic analysis of the input bits of said current sub-block and the output of the bit encoding step to determine the disparity of the current sub-block.

7. A coding method as set forth in claim 6 including the step of notifying the coding system when a specific input 8 bit block is to be representative of a special character outside of the domain of the normal 256 characters representable by the 8 bit code pattern and producing specially encoded output sub-blocks whenever such special character indication accompanies a given 8 bit input sub-block.

8. A coding method as set forth in claim 7 including factoring said special character indication (K bit) into said bit encoding and disparity determining steps for the 3 bit input sub-block, whereby all of the 4 bit encoded sub-blocks for the special characters have an alternate form which is assigned based solely on a determination of the last non-zero disparity (D-1) sub-block.

9. A coding method as set forth in claim 8 wherein the step of encoding said special character sub-blocks distinctly from encoded data sub-blocks, includes determining if a predetermined run length and disparity is present in the immediately preceding output sub-block and providing a first output sub-block for such special character if said predetermined run length is present and a second output sub-block if said predetermined run length is not present.

10. A coding method as set forth in claim 9 wherein the step of providing said second output sub-block comprises complementing said first output sub-block in accordance with both a run length and disparity determination.

11. A binary data encoding apparatus for producing a DC balanced (0,4) run length limited rate 8B/10B code from an unconstrained input data stream including means for supplying consecutive 8 bit data blocks to said apparatus, means for partitioning the 8 bit input block into two sub-blocks consisting of 5 and 3 contiguous bits, means for testing each input sub-block to determine if any of the individual bits require alteration during encoding and altering predetermined bits based on said determination to produce an alternate code pattern from said input bit pattern, means for determining the disparity (D0) of the current output sub-block being coded, means for determining the disparity (D-1) of the last non-zero sub-block coded and generating a first code pattern as the current output sub-block for certain of the output sub-blocks if the last non-zero disparity sub-block in the output code stream was of a first polarity, means for generating the complement of said first code pattern if the last non-zero disparity sub-block was of the opposite polarity.

12. A data encoding apparatus as set forth in claim 11 wherein said means for partitioning includes means for gating the 3 bit and 5 bit input data sub-blocks into the encoding apparatus for substantially concurrent encoding.

13. A data encoding apparatus as set forth in claim 12 including means for concatenating an extra bit of a predetermined value at the end of each input data sub-block to form each encoded output sub-block, and means for changing the predetermined value of said extra bit if it is found that a predetermined bit pattern is present in said current data input sub-block.

14. A data encoding apparatus as set forth in claim 13 wherein the means for generating the complement of said first code pattern comprises means for combining the output of said testing means and in said disparity determining means do produce a complementation signal which causes the complement of said first code pattern generated by the system to be gated to the output thereof as the encoded output sub-block.

15. A data encoding apparatus as set forth in claim 14 wherein said means for complementing includes means for evaluating all of the input data bits of both sub-blocks and also the polarity (negative or positive) of the last non-zero encoded sub-block.

16. A data encoding apparatus as set forth in claim 15 wherein the means for determining the disparity (D0) of the current sub-block includes means for logically combining the input bits of said current sub-block with the output of the testing means to determine if the disparity of the current sub-block (D0) is zero, positive or negative.

17. A data encoding apparatus as set forth in claim 16 including means for indicating that a particular 8 bit input block is a special character outside of the domain of the 256 characters normally representable by the 8 bit input data block and means actuable in response to said indication for producing a specially encoded 4 bit output sub-block from said input 8 bit block whenever such special character indication accompanies a given 8 bit input block.

18. A data encoding apparatus as set forth in claim 17 wherein the means for encoding said special character 3 bit sub-block distinctly from a 3 bit data character input sub-block includes means for determining if a predetermined run length is present in the immediately preceding encoded 6 bit output sub-block for the associated 5 bit data input block and for providing a first 4 bit encoded output sub-block for such special character if said predetermined run length is present and a different 4 bit coded output sub-block if said predetermined run length is not present.

19. A data encoding apparatus as set forth in claim 18 wherein the means for providing said different 4 bit coded sub-block includes means for complementing said first encoded 4 bit output sub-block.

20. A binary data encoding apparatus for producing a DC balanced (0,4) run length limited rate 8B/10B code from an unconstrained input data stream including means for supplying consecutive 8 bit data blocks to said apparatus, means for partitioning the 8 bit input block into two sub-blocks consisting of 5 and 3 contiguous bits, said partitioning means including means for gating the 3 bit and 5 bit input data sub-blocks into the encoding apparatus for substantially concurrent encoding in separate circuitry provided for each sub-block, means for concatenating an extra bit of a predetermined value at the end of each input data sub-block to form the additional bit of each encoded output sub-block, means for testing each input sub-block to determine if any of the individual bits or the extra bit require alteration during encoding and altering predetermined bits based on said determination to produce an alternate code pattern from said input bit pattern, means for determining the disparity (D0) of the current output sub-block being coded including means for logically combining the input bits of said current input sub-block with the output of the testing and altering means to determine if the disparity of the current sub-block (D0) is zero, positive or negative, means for determining the disparity (D-1) of the last non-zero sub-block coded and generating a first code pattern as the current output sub-block for certain of the input sub-blocks if the last non-zero disparity sub-block in the output code stream was of a first polarity, means for generating the complement of said first code pattern if the last non-zero disparity sub-block was of the opposite polarity, said complementing means including means for evaluating all of the input data bits of both sub-blocks and also the polarity (negative or positive) of the last non-zero encoded sub-block.

* * * * *